(12) United States Patent
De Godoy Peixoto et al.

(10) Patent No.: US 10,833,694 B2
(45) Date of Patent: Nov. 10, 2020

(54) CIRCUITS AND METHODS FOR TIME-DELAY TO DIGITAL CONVERTERS

(71) Applicants: Daniel De Godoy Peixoto, Austin, TX (US); Xiaofan Jiang, New York, NY (US); Peter Kinget, Summit, NJ (US)

(72) Inventors: Daniel De Godoy Peixoto, Austin, TX (US); Xiaofan Jiang, New York, NY (US); Peter Kinget, Summit, NJ (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 16/378,550

(22) Filed: Apr. 8, 2019

(65) Prior Publication Data

US 2019/0312582 A1 Oct. 10, 2019

Related U.S. Application Data

(60) Provisional application No. 62/831,173, filed on Apr. 8, 2019, provisional application No. 62/654,041, filed on Apr. 6, 2018.

(51) Int. Cl.
| | |
|---|---|
| *H03M 1/50* | (2006.01) |
| *H03M 1/12* | (2006.01) |
| *H03K 5/135* | (2006.01) |
| *G04F 10/06* | (2006.01) |
| *H03L 7/085* | (2006.01) |
| *H03M 1/20* | (2006.01) |

(52) U.S. Cl.
CPC .......... *H03M 1/1215* (2013.01); *G04F 10/06* (2013.01); *H03K 5/135* (2013.01); *H03L 7/085* (2013.01); *H03M 1/20* (2013.01)

(58) Field of Classification Search
CPC .............................. H03M 1/1215; H03M 1/20
USPC ........................................ 341/155, 166, 159
See application file for complete search history.

(56) References Cited

U.S. PATENT DOCUMENTS

| | | | |
|---|---|---|---|
| 7,386,286 B2 * | 6/2008 | Petrovic | H03D 3/007 329/323 |
| 2011/0095927 A1 * | 4/2011 | Pagnanelli | H03M 3/468 341/166 |
| 2018/0011162 A1 | 1/2018 | Bovard et al. | |
| 2018/0059211 A1 | 3/2018 | Furman et al. | |
| 2018/0081047 A1 | 3/2018 | Gander | |

FOREIGN PATENT DOCUMENTS

| | | |
|---|---|---|
| WO | WO 2018045594 | 3/2018 |
| WO | WO 2018045973 | 3/2018 |

OTHER PUBLICATIONS

Bertozzi et al., "Stereo Vision-Based Vehicle Detection", in IEEE Intelligent Vehicle Symposium, Oct. 3-5, 2000, pp. 1-6.

(Continued)

*Primary Examiner* — Peguy Jean Pierre
(74) *Attorney, Agent, or Firm* — Byrne Poh LLP (57) ABSTRACT

In accordance with some embodiments, polarity-coincidence, adaptive time-delay estimation (PCC-ATDE), mixed-signal techniques are provided. In some embodiments, these techniques use 1-bit quantized signals and negative-feedback architectures to directly determine a time-delay between signals at analog inputs and convert the time-delay to a digital number.

10 Claims, 12 Drawing Sheets

(56) References Cited

OTHER PUBLICATIONS

Chacon-Rodriguez et al., "A Low-Power Integrated Circuit for Interaural Time Delay Estimation Without Delay Lines", in IEEE Transactions on Circuits and Systems II, vol. 56, issue 7, Jul. 2009, pp. 575-579.

Chandrasekaran et al., "SEUS: A Wearable Multi-Channel Acoustic Headset Platform to Improve Pedestrian Safety", in the Proceedings of the 14th ACM Conference on Embedded Network Sensor Systems, Nov. 14-16, 2016, pp. 330-331.

DiBiase et al., "Robust Localization in Reverberant Rooms", in Microphone Arrays, Springer 2001, pp. 1-24.

Dokic et al., "Real-Time Adaptive Filters for Time-Delay Estimation", in Mechanical Systems and Signal Processing, vol. 6, issue 5, Sep. 1992, pp. 403-418.

Fertner et al., "Comparison of Various Time Delay Estimation Methods by Computer Simulation", IEEE Transactions on Acoustics, Speech, and Signal Processing, vol. ASSP-34, No. 5, Oct. 1986, pp. 1329-1330.

Halupka et al., "Robust Sound Localization in 0.18 um CMOS", in IEEE Transactions on Signal Processing, vol. 53, No. 6, Jun. 2005, pp. 2243-2250.

Jeong et al., "Always-On 12-nW Acoustic Sensing and Object Recognition Microsystem for Unattended Ground Sensor Nodes", in IEEE Journal of Solid State Circuits, vol. 53, issue 1, Jan. 2018, pp. 261-274.

McDonald et al., "Real-Time Vehicle Identification Performance Using FPGA Correlator Hardware", in IEEE Transactions on Intelligent Transportation Systems, vol. 13, No. 4, Dec. 2012, pp. 1891-1895.

Seok et al., "Optimal Technology Selection for Minimizing Energy and Variability in Low Voltage Applications", in the Proceedings of the 2008 International Symposium on Low power Electronics and Design, Aug. 11-13, 2008, pp. 9-14.

Shaver, K., "Safety Experts to Pedestrians: Put the Smartphones Down and Pay Attention", in the Washington Post, Sep. 20, 2014, pp. 1-5.

Tang et al., "Low-Complexity Algorithm and Circuit Design of Correlation for Time Delay Estimation", in 6th International Conference on Electronics Information and Emergency Communication, Jun. 17-19, 2016.

Vleck et al., "The Spectrum of Clipped Noise", in Proceedings of the IEEE, vol. 54, No. 1, Jan. 1966, pp. 2-19.

Yang et al., "A 0.5V 55uW 64×2-Channel Binaural Silicon Cochlea for Event-Driven Stereo-Audio Sensing" in IEEE Journal of Solid-State Circuits, vol. 51, No. 11, Nov. 2016, pp. 2554-2569.

Zhu et al., "A Fast Accurate Time Delay Estimation Method in the Digital Predistortion Subsystem", in Procedia Computer Science, vol. 107, Apr. 2017, pp. 855-860.

* cited by examiner

CIRCUITS AND METHODS FOR TIME-DELAY TO DIGITAL CONVERTERS

CROSS-REFERENCE TO RELATED APPLICATION

The application claims the benefit of U.S. Provisional Patent Application No. 62/831,173, filed Apr. 8, 2019, and U.S. Provisional Patent Application No. 62/654,041, filed Apr. 6, 2018, each of which is hereby incorporated by reference herein in its entirety.

Statement Regarding Federally Sponsored Research Or Development

This invention was made with government support under grant 1704899 awarded by the National Science Foundation. The government has certain rights in the invention.

BACKGROUND

Time-delay estimations (TDE) are used to extract the time difference of arrival between microphones in sound-source localization systems.

The standard approach to TDE uses the direct cross-correlation (DCC) function. When using the DCC function, for each TDE, time frames of the input signals are stored and all the points of the DCC function are calculated. The argument of the maximum of the DCC corresponds to the intersignal time delay between the signal inputs. With a sampling frequency above 50 KS/s, the storage of the frames and the arithmetic operations to calculate the DCC values are a roadblock towards achieving a sub-µW implementation as is needed in mobile, wearable, or IoT applications.

The low complexity of adaptive time-delay estimation (ATDE) techniques makes them an attractive approach to TDE, but these techniques still require a high-resolution ADC after the sensors. Thus, these are also not suitable for many low power applications Bio-inspired silicon cochlea estimate the time difference in input signals by translating audio stimulus into asynchronous events. However, the power consumption of bio-inspired silicon cochlea is in the µW range, which makes such cochlea unsuitable for certain low power applications.

Accordingly, new mechanisms for TDE are desirable.

SUMMARY

In accordance with some embodiments, circuits and methods for time-delay to digital converters are provided. In some embodiments, circuits for a time-delay to digital converter are provided, the circuits comprising: a first microphone having a first output; a second microphone having a second output; a first one-bit analog-to-digital converter having a first input coupled to the first output and having a third output; a second one-bit analog-to-digital converter having a second input coupled to the second output and having a fourth output; a first variable time delay having a third input coupled to the third output, a fourth input, and a fifth output, wherein the fourth input controls a delay amount of the first variable time delay; a second variable time delay having a fifth input coupled to the fourth output, a sixth input, and a sixth output, wherein the sixth input controls a delay amount of the second variable time delay; a first mixer having a seventh input coupled to the fifth output, an eighth input coupled to the sixth output, and a seventh output; a third variable time delay having a ninth input coupled to the sixth output, and a eighth output; a second mixer have a tenth input coupled to the fifth output, and eleventh input coupled to the eighth output, and a ninth output; a subtractor having a twelfth input coupled to the seventh output, a thirteenth input coupled to the 9th output, and a tenth output; an accumulator having a fourteenth input coupled to the tenth output, and an eleventh output; an attenuator having a fifteenth input coupled to the eleventh output, and a twelfth output; a differential splitter having a sixteenth input coupled to the twelfth output, a thirteenth output, and a fourteenth output; a first adder having a seventeenth input coupled to the thirteenth output, an eighteenth input coupled to an offset signal, and a fifteenth output coupled to the sixth input; and a second adder having a nineteenth input coupled to the fourteenth output, an twentieth input coupled to the offset signal, and a sixteenth output coupled to the fourth input.

DETAILED DESCRIPTION

In accordance with some embodiments, polarity-coincidence, adaptive time-delay estimation (PCC-ATDE), mixed-signal techniques are provided. In some embodiments, these techniques use 1-bit quantized signals and negative-feedback architectures to directly determine a time-delay between signals at analog inputs and convert the time-delay to a digital number.

In a time delay estimation (TDE), the sampling frequency of the data converters $F_S$ defines the resolution. The noise from approaching automobiles or other vehicles has dominant spectral components below 250 Hz. To support a −1 ms to +1 ms delay range with 8-bit resolution for such noise-like sources, the audio signal needs to be sampled at >50 KS/s, i.e. 100× the Nyquist rate, in some embodiments.

Consider the outputs of two microphones, $M_1(t)$ and $M_2(t)$, which capture the signal of the single source $x(t)$ at different positions in space:

$$M_1(t)=x(t)+n \qquad (1)$$

$$M_2(t)=A.x(t-D)+n_2(t) \qquad (2)$$

where D is the time delay that the algorithm needs to determine, $n_1(t)$ and $n_2(t)$ are random noise, and A is the gain (or attenuation) difference in the microphones. In prior mechanisms, the estimation of D requires computing the direct cross-correlation $$DCC_{M_1,M2}(\tau) = \frac{1}{T}\int_0^T M_1(t), M_2(t-\tau)dt \qquad (3)$$

for many different T and then determining the argument of the peak:

$$D=\mathrm{argmax}(DCC_{M_1,M2}(\tau)) \qquad (4)$$

There are multiple ways to compute the $DCC_{M1,M2}$, however, each is complex.

An alternative to using the DCC function for performing TDE is to use the polarity-coincidence correlation function (PCC):

$$PCC_{M_1,M_2}(\tau) = \frac{1}{T}\int_0^T \mathrm{sgn}(M_1(t)), \mathrm{sgn}(M_2(t-\tau))dt \qquad (5)$$

It is known that $$PCC_{M_1,M2}(\tau) = \frac{2}{\pi}\sin^{-1}\left(\frac{DCC_{M_1,M2}(\tau)}{\max(DCC_{M_1,M2}(\tau))}\right) \qquad (6)$$

hence $\mathrm{argmax}(PCC_{M1,M2})=\mathrm{argmax}(DCCN_{M1,M2})$. Note that the computation of PCC only needs one-bit signals, in contrast to DCC which requires multi-bit signals.

Regardless of how one obtains $DCC_{M1,M2}$ or $PCC_{M1,M2}$, their computation involves storing a large frame of both $M_1(t)$ and $M_2(t)$, calculating and storing all the points of the cross-correlation within the TDE range, and finally searching for the argument of the peak.

In accordance with some embodiments, polarity-coincidence-correlation, adaptive, time-delay estimation (PCC-ATDE) approaches are provided. The PCC-ATDE approaches use only two values of a polarity-coincidence correlation function to close a negative feedback loop that continuously tracks intersignal delay.

Figure 1:
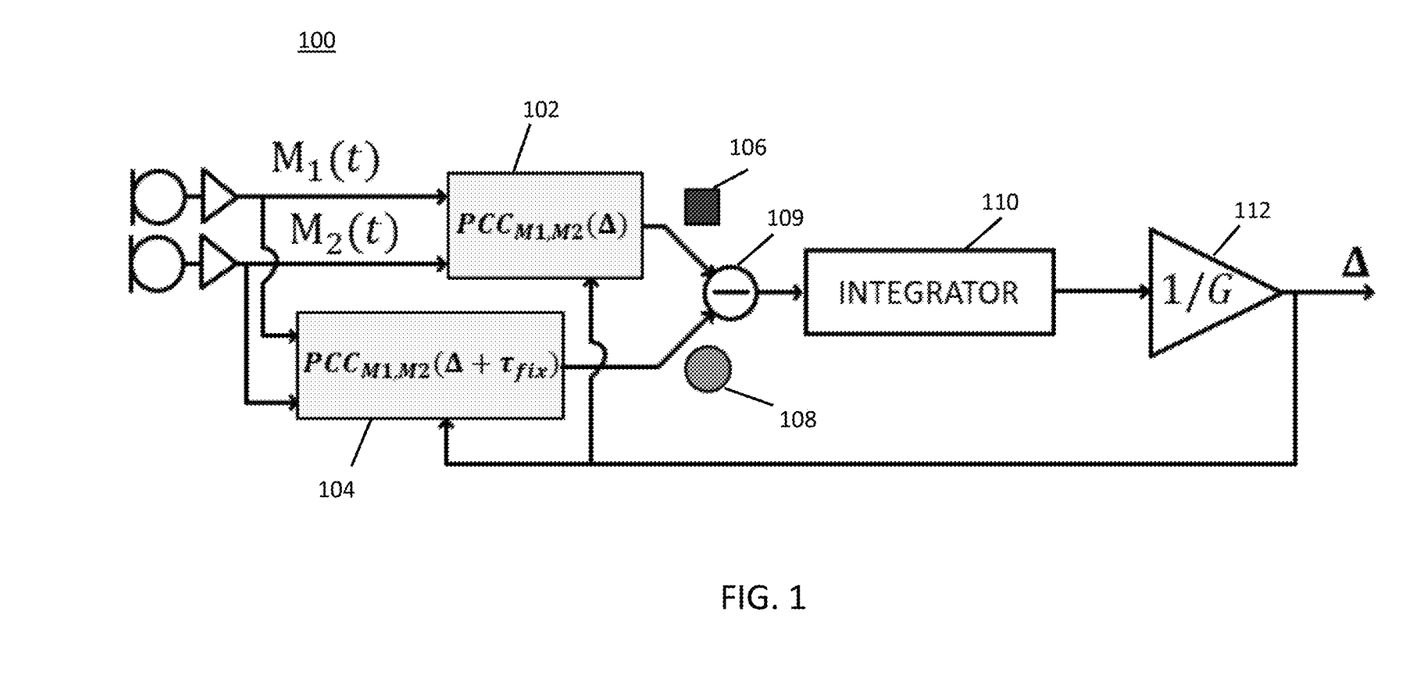
FIG. 1 is a block diagram illustrating an example of the principle of a polarity-coincidence, adaptive time-delay estimation (PCC-ATDE) mechanism in accordance with some embodiments.

FIG. 1 illustrates an example 100 of the principle of the PCC-ATDE in accordance with some embodiments. As shown, a loop is formed from blocks 102 and 104, subtractor 109, integrator 110, and attenuator 112. Only two points of the $PCC_{M1,M2}(\tau)$ are calculated at boxes 102 and 104; box 102 with and argument A, with an output marked by a square 106, and box 104 with an argument $\Delta+\tau_{fix}$, with an output marked by a circle 108. To search for the $D=\mathrm{argmax}(PCC_{M1,M2})$, the loop takes the difference between the two $PCC_{M1,M2}$ values using subtractor 109.

Figure 2:
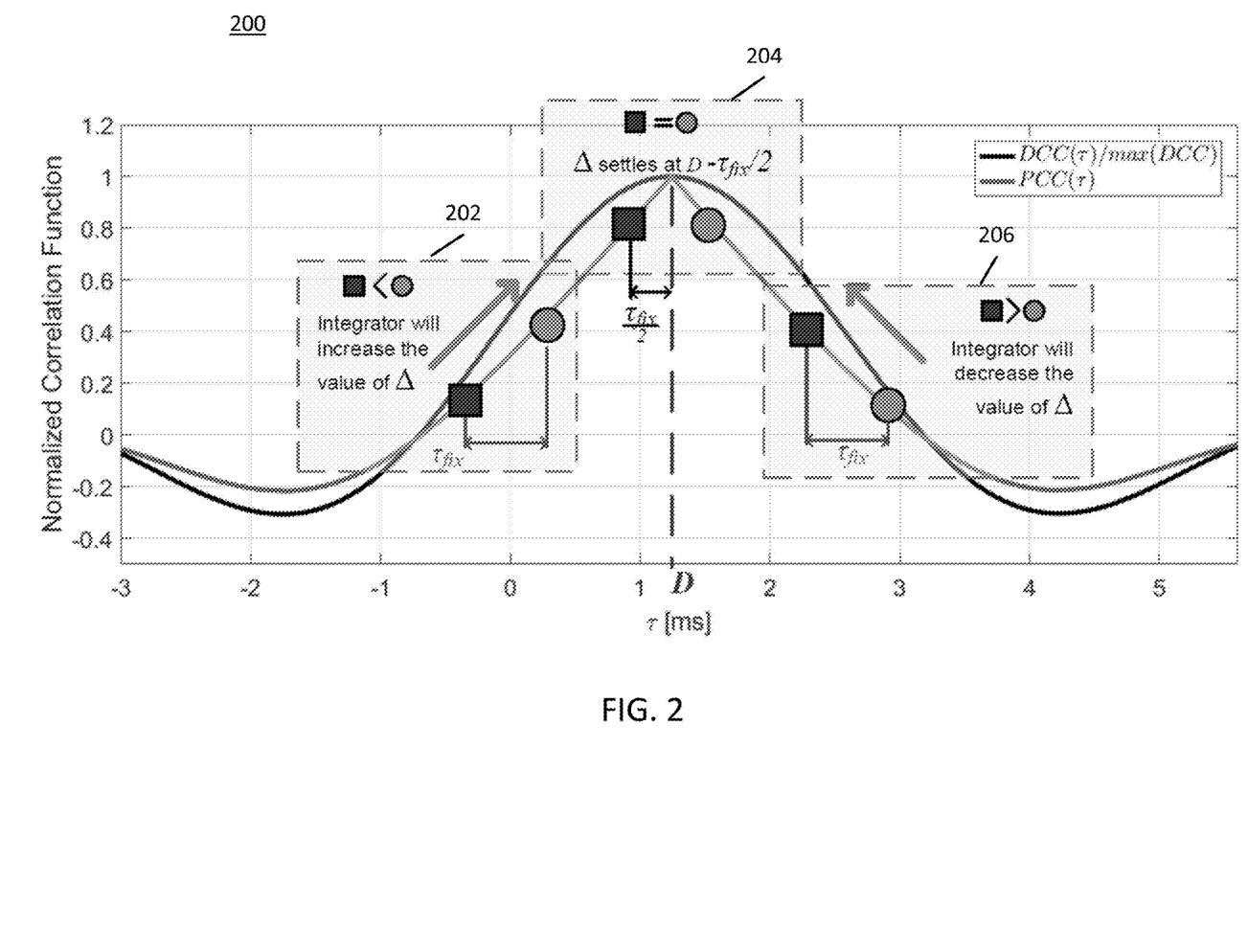
FIG. 2 is an example of a graph of possible $PCC_{M1,M2}$ values in accordance with some embodiments.

FIG. 2 illustrates an example 200 of a graph of possible $PCC_{M1,M2}$ values in accordance with some embodiments. If the current $\Delta$ value is sufficiently close to the peak, the difference between $PCC_{M1,M2}(\Delta)$ and $PCC_{M1,M2}(\Delta+\tau_{fix})$ indicates whether $\Delta$ is smaller or larger than the argument of the peak. The integrator will continuously increase or decrease the value of $\Delta$ until $PCC_{M1,M2}(\Delta)$ and $PCC_{M1,M2}(\Delta+\tau_{fix})$ have equal values, locking the loop at $\Delta=D-\tau_{fix}/2$, which gives a measurement of the desired intersignal delay D. If the values fall within box 202, then integrator 110 in FIG. 1 will increase the value of A. If the values fall within box 204, then $\Delta$ settles at $D-\tau_{fix}/2$. If the values fall within box 206, then integrator 110 in FIG. 1 will decrease the value of $\Delta$.

Attenuator 1/G 112 in FIG. 1 sets the speed and bandwidth of the loop.

A practical problem for the architecture in FIG. 1 is that to calculate the $PCC_{M1,M2}$ values at blocks 102 and 104, a large frame of each input signal needs to be stored.

Figure 3:
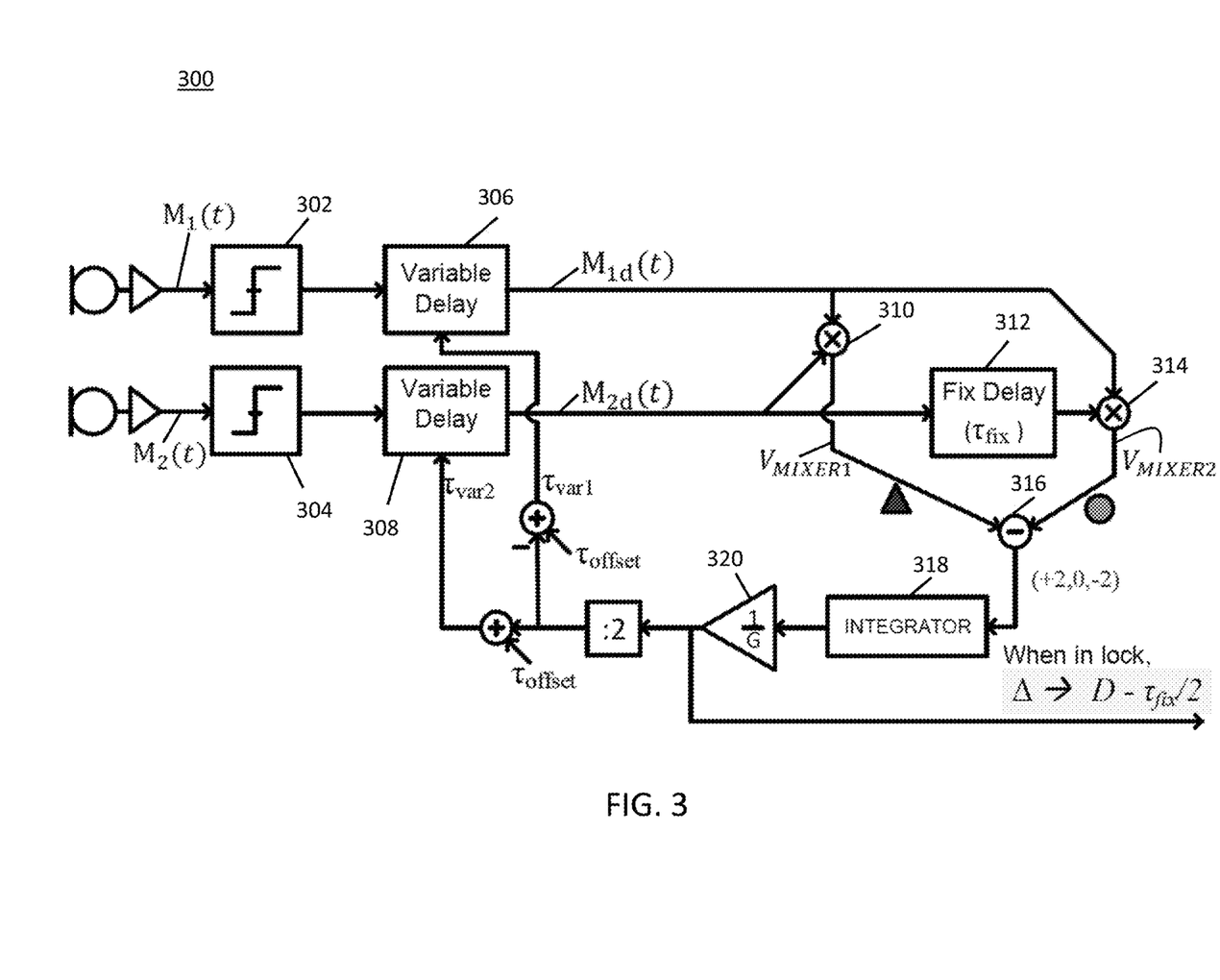
FIG. 3 is an example of a circuit for a PCC-ATDE mechanism in accordance with some embodiments.

In accordance with some embodiments, this problem may be overcome using example circuit 300 of FIG. 3. As shown, in some embodiments, $PCC_{M1,M2}(\Delta)$ and $PCC_{M1,M2}(\Delta+\tau_{fix})$ can be extracted in the PCC-ATDE without storing signal frames. The analog microphone signals $M_1(t)$ and $M_2(t)$ are directly connected to comparators 302 and 304, which each act as a 1-bit analog to digital converter (ADC). In some embodiments, each of comparators 302 and 304 output a+1 if the microphone signal at the comparator's input is greater than zero, and a−1 otherwise.

The outputs of comparators 302 and 304 are then provided to variable-delay cells 306 and 308, respectively, which have delays of $\tau_{var1}$ and $\tau_{var2}$, respectively. The outputs of the variable delay cells produce signals $M_{1d}(t)$ and $M_{2d}(t)$:

$$M_{1d}(t)=\mathrm{sgn}(x(t-\tau_{var1})+n_1(t-\tau_{var1})) \qquad (7)$$

$$M_{2d}(t)=\mathrm{sgn}(A.x(t-\tau_{var2}-D)+n_2(t-\tau_{var2})) \qquad (8)$$

Figure 4:
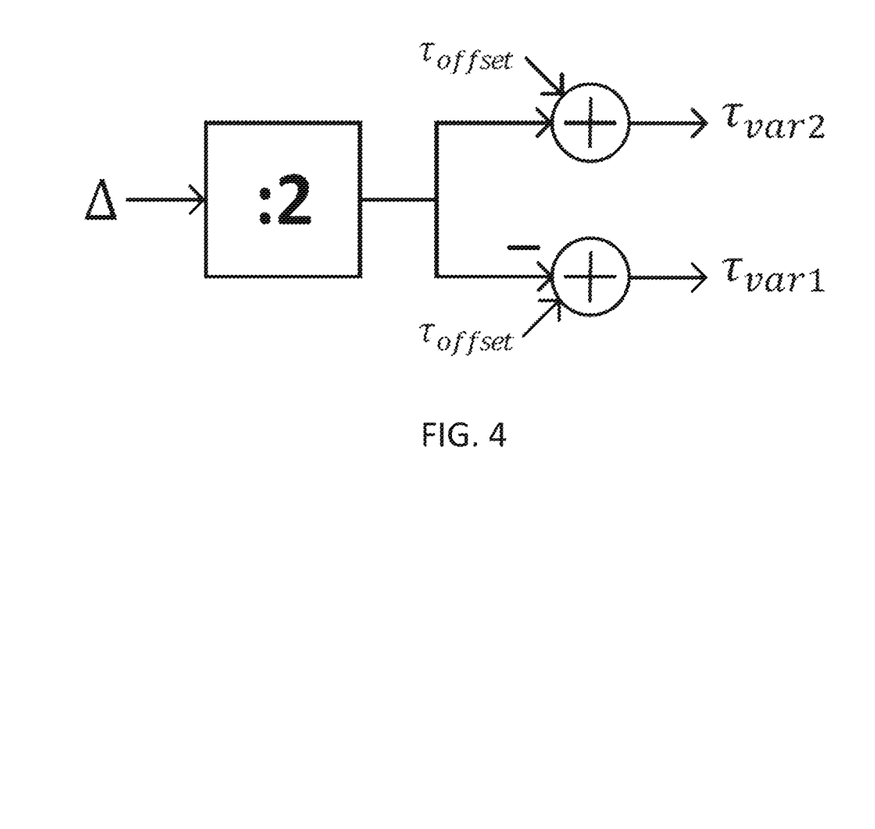
FIG. 4 is an example of block diagram illustrating how variable delays can be determined in accordance with some embodiments.

As shown in FIG. 4, the variable delays $\tau_{var1}$ and $\tau_{var2}$ are defined such that $\Delta=\tau_{var2}-\tau_{var1}$. And, since a variable delay line can only introduce positive delay values, an offset $\tau_{offset}$ is added such that $\tau_{var1}$ and $\tau_{var2}$ are always positive. When the loop settles, $\Delta$ corresponds to the time-delay estimation between the inputs, and can assume both positive and negative values depending on which input is ahead of the other.

Referring back to FIG. 3, next, $M_{1d}(t)$ and $M_{2d}(t)$ are multiplied by multiplier 310 to create $V_{MIXER1}(t)$. The average of $V_{MIXER1}(t)$ is the same as $PCC_{M1,M2}(\Delta)$:

$$\frac{1}{T}\int_{t-T}^{t} V_{MIXER1}(t)dt = \frac{1}{2}\int_{t-T}^{T}\mathrm{sgn}(M_1(t)), \qquad (9)$$

$$\mathrm{sgn}(M_2(t-\Delta))dt := PCC_{M_1,M_2}(\Delta)$$

$M_{2d}(t)$ is further delayed by fixed delay 312 by a fixed value, $\tau_{fix}$, and then multiplied by multiplier 314 with $M_{1d}(t)$ to create $V_{MIXER2}$. The average of $V_{MIXER2}$ is $PCC_{M1,M2}(\Delta+\tau_{fix})$. Note that the averages of the outputs of multipliers 310 and 314, $V_{MIXER1}$ and $V_{MIXER2}$, do not need to be explicitly calculated.

The difference between $V_{MIXER1}$ and $V_{MIXER2}$ is then determined by subtractor 316. This will result in difference values of +2, 0, or −2.

Next, loop integrator 318 averages the difference values and attenuates the higher frequency components of these signals.

Attenuator 320 then receives the output of the integrator and produces an attenuated signal. The loop bandwidth, which is directly controlled by the attenuator, determines the effective length T of the averages calculated by the integrator.

Figure 5:
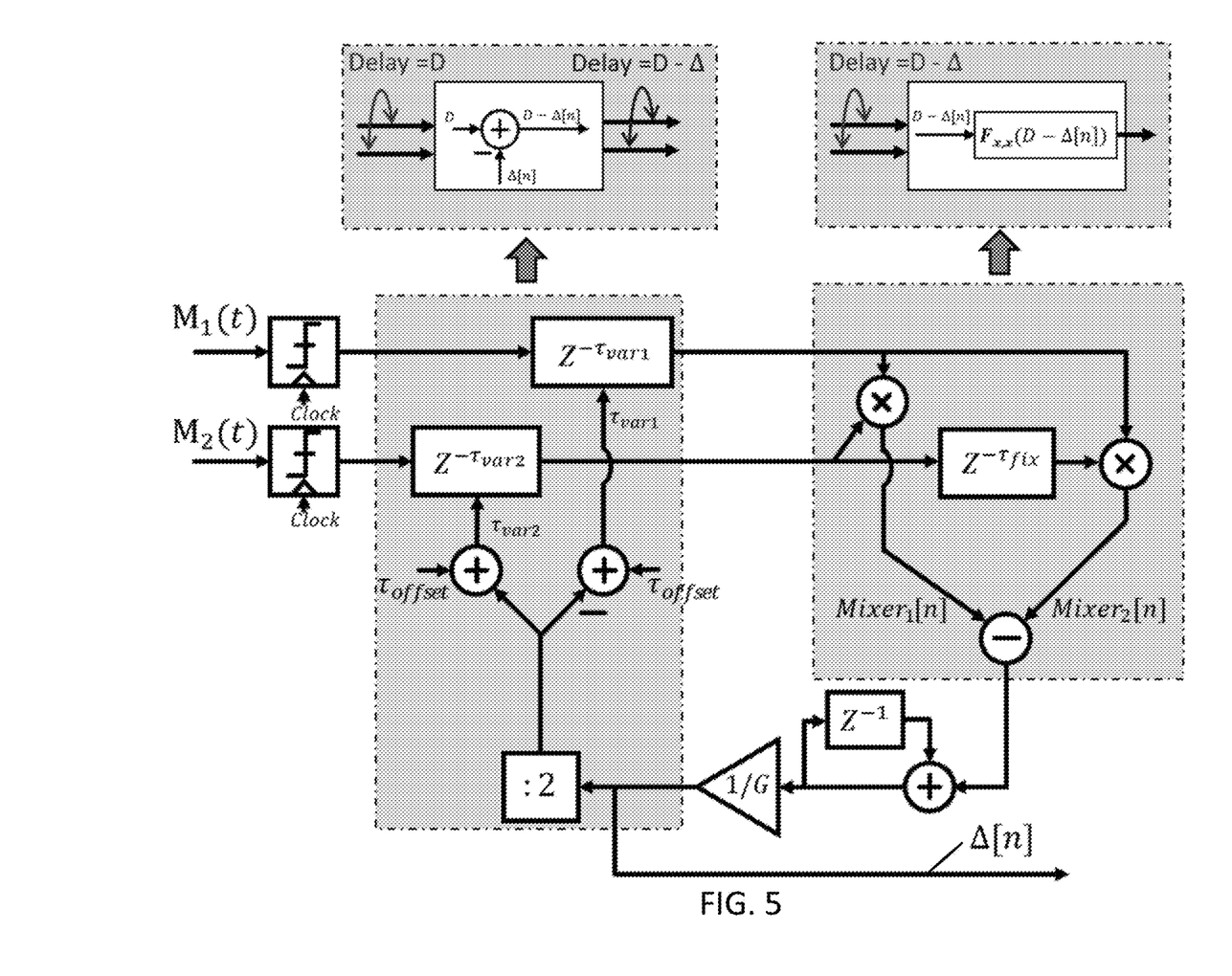
FIG. 5 is an example of a block diagram of a time-discrete implementation using latched comparators, digital delay cells, XORs, adders, and dividers in accordance with some embodiments.

Turning to FIG. 5, a block diagram of a time-discrete implementation using latched comparators, digital delay cells, XORs, adders, and dividers is shown in accordance with some embodiments. The two shaded areas have different functionalities: the section on the left is used to add a delay of $\Delta[n]$ to the microphone signals; the section on the right is used to determine $F_{x,x}$, which is a function of the intersignal time-delay of its input.

As shown in FIG. 5, the output $\Delta[n]$ at timestep n is given by:

$$\Delta[n] = \Delta[n-1] + \frac{1}{G} \cdot (Mixer_1[n] - Mixer_2[n]) \quad (10)$$

Figure 6:
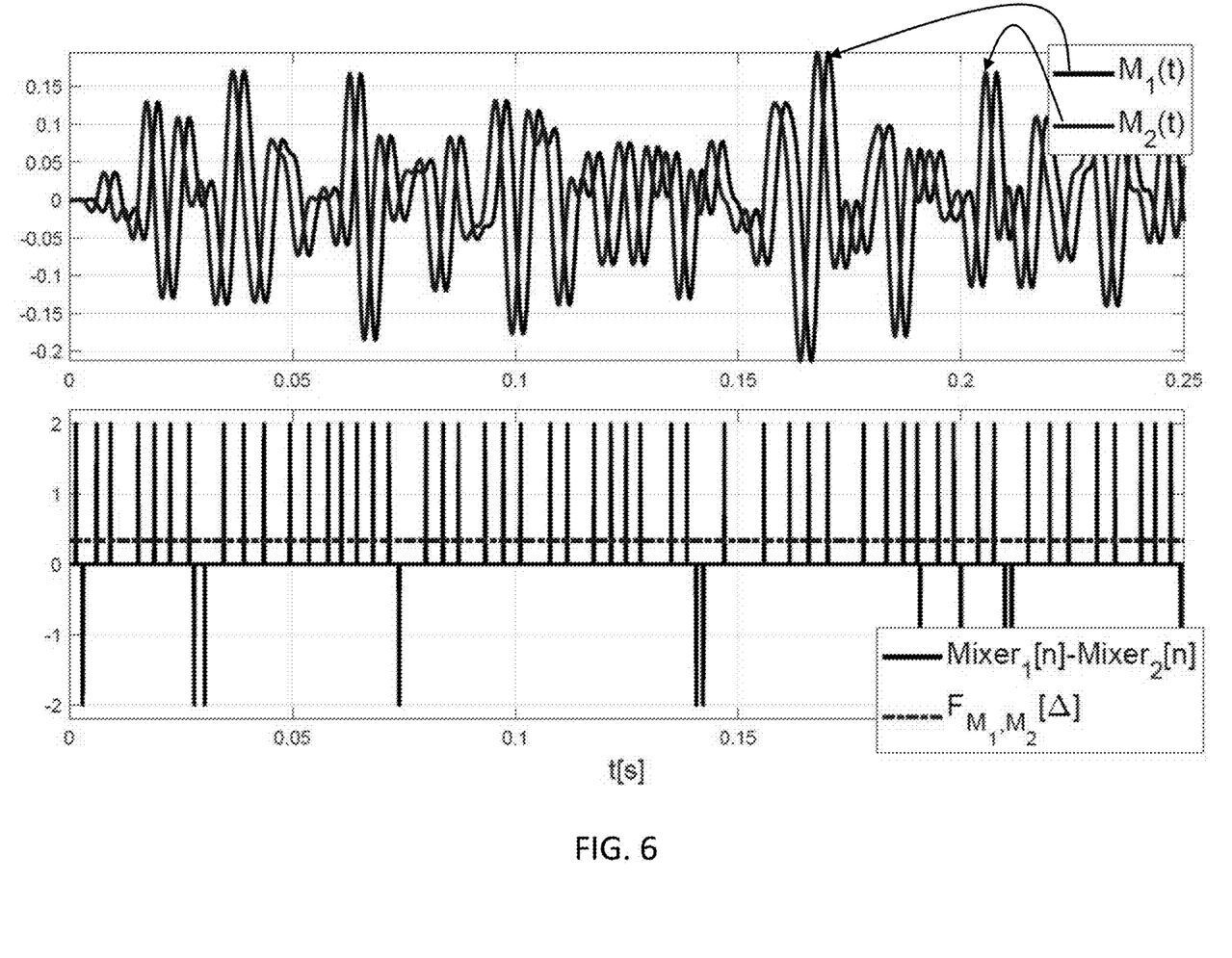
FIG. 6 is an example of two graphs showing values for $M_1(t)$, $M_2(t)$, $Mixer_1[n]-Mixer_2[n]$, and $F_{M1,M2}[\Delta]$ in accordance with some embodiments.

As illustrated in FIG. 6, the result of the subtraction $Mixer_1[n]-Mixer_2[n]$ is a fast-switching digital signal that can only assume values of −2,0,2. Since $Mixer_1[n]-Mixer_2[n]$ has much higher frequency components than the PCC-ATDE loop in some embodiments, it can be decomposed into two components:

$$Mixer_1[n]-Mixer_2[n]=F_{M_1,M_2}(\Delta[n])+e[n] \quad (11)$$

where e[n] contains the high-frequency components, with average zero, and $F_{M_1,M_2}$ is the average value of $Mixer_1[n]-Mixer_2[n]$. As in (9), it can be shown that $F_{m_1,M_2}$ is mathematically equal to the difference of two values of the $PCC_{M1,M2}$ with argument $\Delta[n]+\tau_{fix}$ and $\Delta[n]$:

$$F_{M_1,M_2}(\Delta[n]) = \frac{1}{T} \sum_{k=n-T}^{n} [Mixer_1[n] - Mixer_2[n]] = \quad (12)$$

$$\frac{1}{T} \sum_{k=n-T}^{n} [sgn(M_1[k - \tau_{var1}[k]]) \cdot sgn(M_2[k - \tau_{var2}[k]]) -$$

$$sgn(M_1[k - \tau_{var2}[k]]) \cdot sgn(M_2[k - \tau_{var2}[k] - \tau_{fix}])] :=$$

$$PCC_{M_1,M_2}(\Delta[n]) - PCC_{M_1,M_2}(\Delta[n] + \tau_{fix})$$

Note that, assuming that the $PCC_{M1,M2}$ and $\tau_{fix}$ are static, $F_{M_1,M_2}$ is a function of the output $\Delta[n]$. $F_{M_1,M_2}(\Delta[n])$ and $e[n]$ can be substituted in (10) to provide:

$$\Delta[n] = \Delta[n-1] + \frac{1}{G} \cdot F_{M_1,M_2}(\Delta[n]) + \frac{1}{G} \cdot e[n] \quad (13)$$

e[n] does not introduce a DC error in $\Delta[n]$, but contributes as noise at the output. If one neglects e[n] and focuses on the low-frequency output of the loop, a non-linear feedback loop that continuously increases or decreases $\Delta[n]$ to keep $F_{M_1,M_2}(\Delta[n])=0$ is obtained.

Based on (13), a delay-domain model can be used to predict the behavior of the PCC-ATDE loop. The PCC-ATDE operates across multiple-domains. Delay-domain models can assist in understanding how the PCC-ATDE operates. In the PCC-ATDE, the function $F_{M_1,M_2}[\Delta]$ is responsible for a domain swap; the value of $F_{M_1,M_2}[\Delta]$ is directly dependent on the difference between estimated time delay $\Delta$ and the intersignal time delay from the microphones D.

Since the only correlation between $M_1(t)$ and $M_2(t)$ comes from the source x(t), the polarity-coincidence correlation function between $M_1$ and $M_2$ can be approximated by the auto-polarity-coincidence correlation function of x(t) shifted by the intersignal delay D:

$$PCC_{M_1,M_2}[\Delta] \approx PCC_{x,x}[\Delta - D] \quad (14)$$

This approximation can be used to understand the contribution of the microphone delay D to the values of $F_{M_1,M_2}$, resulting in the function $F_{x,x}$:

$$\Delta[n] = \Delta[n-1] + \frac{1}{G} \cdot F_{x,x}[\Delta[n] - D] + \frac{1}{G} \cdot e[n] \quad (16)$$

Figure 7:
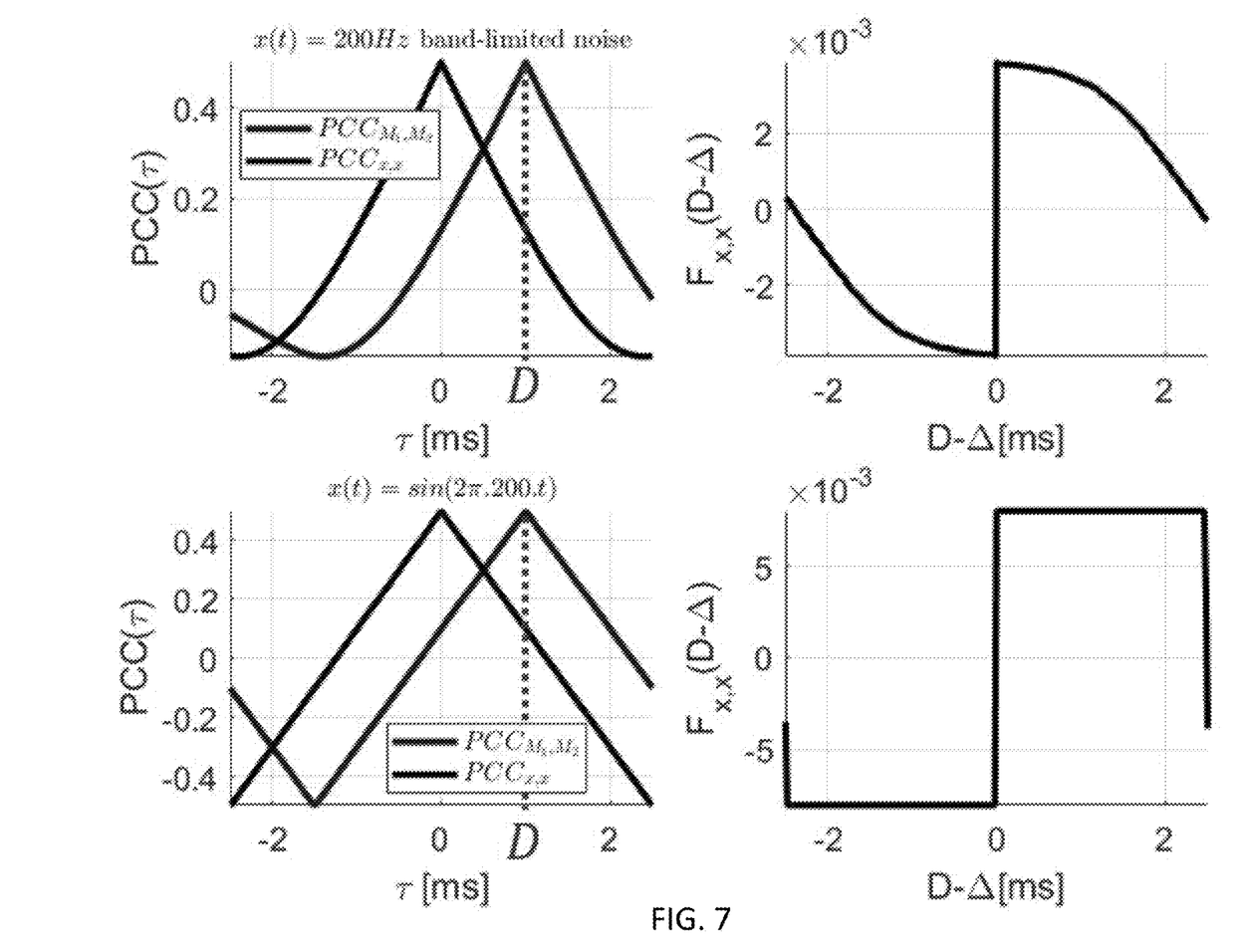
FIG. 7 is an example of graphs showing values for $PCC(\tau)$ and $F_{x,x}(D-\Delta)$ in accordance with some embodiments.

The approximation in (14) and $F_{x,x}$ are illustrated in FIG. 7 in accordance with some embodiments. Examples of $PCC_{M1,M2}$ and $PCC_{x,x}$ are overlapped for a band-limited noise x(t) (top left in FIG 7) and a sinusoidal x(t) (bottom left in FIG. 7). Next to each of them is the resulting $F_{x,x}(D-\Delta)$. Notice that $F_{x,x}$ only depends on the source signal x(t) and the fixed delay $\tau_{fix}$; and, since it is defined by the difference of two $PCC_{x,x}$ values spaced by $\tau_{fix}$, it can be understood as the derivative of $PCC_{x,x}$.

Introducing $F_{x,x}$ into (13), we now have a direct relation between the output of the loop $\Delta[n]$ and the intersignal delay D that was previously implicit in $F_{M_1,M_2}$:

$$F_{M_1,M_2}[\Delta] \approx PCC_{x,x}[\Delta - D] - PCC_{x,x}[\Delta - D - \tau_{fix}] = F_{x,x}[\Delta - D] \quad (15)$$

Figure 8:
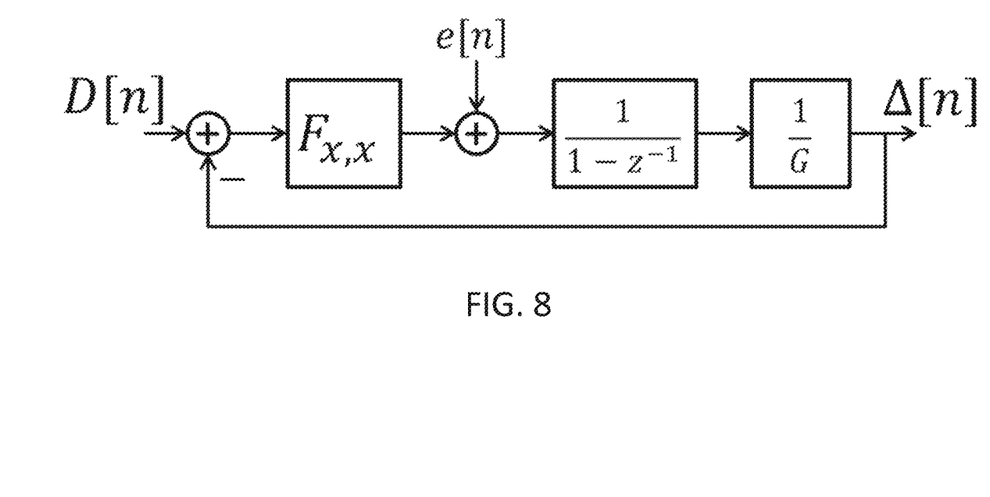
FIG. 8 is an example of delay domain model in accordance with some embodiments.

Using (16), the delay-domain model in FIG. 8 can be obtained. This model can be used as a tool for the extraction of the system's transient and steady-state response, and also to determine the boundaries for the correct functioning of the loop. The low number of elements in the model and the first-order negative-feedback architecture create a misleading impression that the PCC-ATDE will follow a conventional analysis. The non-linear, x(t)-dependent function $F_{x,x}$ is a complex mathematical element that affects all the parameters of the system, from the range of converter to the settling time and bandwidth.

In order to maintain the negative feedback and guarantee the convergence to the correct time-delay estimation, $F_{x,x}[\Delta-D]$ has to have positive values for $\Delta>D$ and negative values for $\Delta<D$. Since $F_{x,x}[\Delta-D]$ is defined as the difference of two consecutive values of $PCC_{x,x}[\tau]$, see (15), the equivalent condition is that the derivative of $PCC_{x,x}[\tau]$ is positive for positive τ and negative for negative τ.

Figure 9:
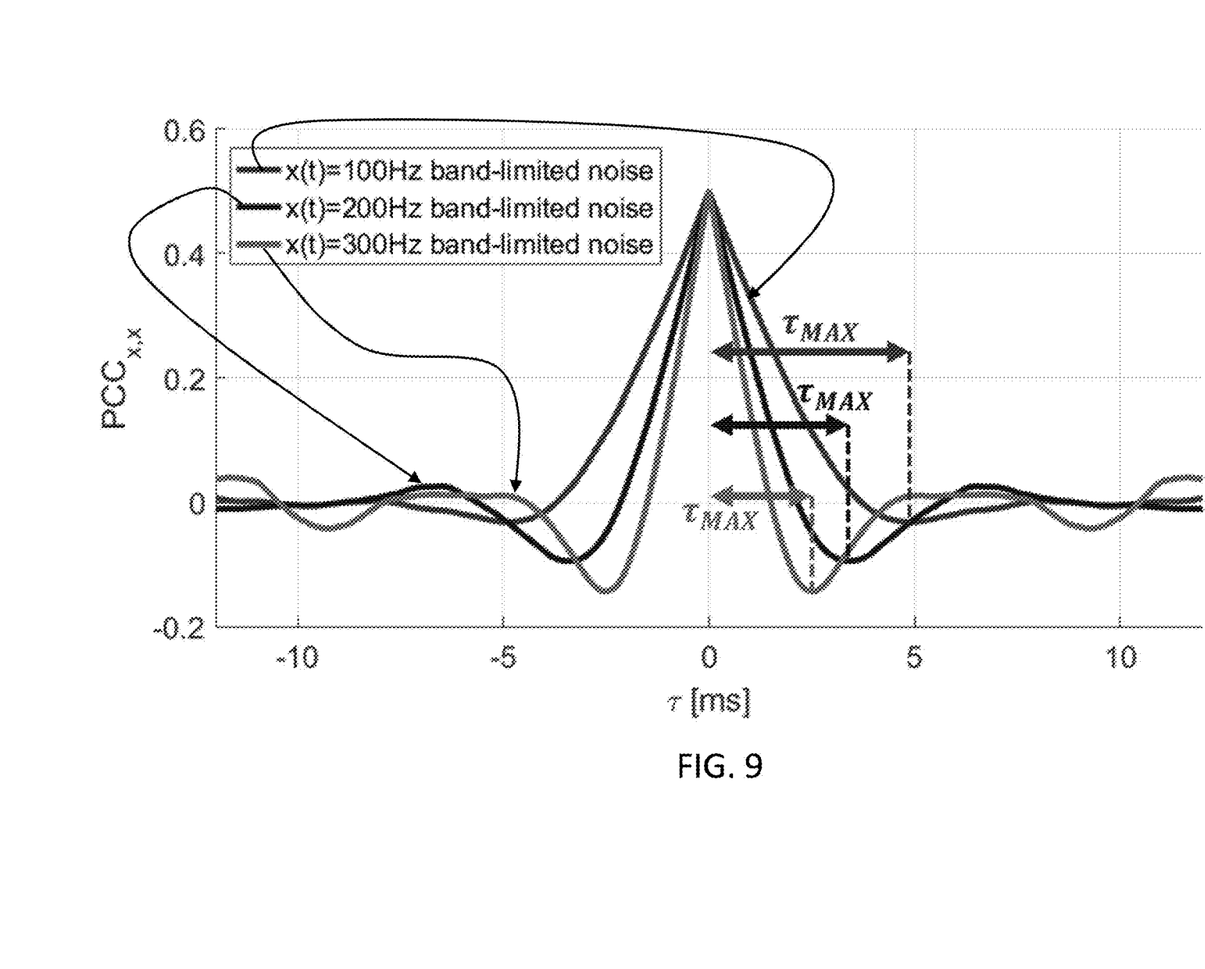
FIG. 9 is an example of a graph of $PCC_{x,x}$ vs. $\tau$ in accordance with some embodiments.

FIG. 9 shows the $PCC_{x,x}[\tau]$ of band-limited noise signals in accordance with some embodiments. As illustrated, the local minima that limit the convergence condition for the PCC-ATDE, are indicated $\tau_{MAX}$ away from the peak of the $PCC_{x,x}[\tau]$ at τ=0. Higher bandwidth analog input signals have their local minimum closer to the origin, and hence a have smaller $\tau_{MAX}$.

To define a range for the system in some embodiments, the difference between $\Delta[n]$ and D must always be less than $\tau_{MAX}$:

$$|\Delta[n]-D|<\tau_{MAX} \quad (17)$$

This can be an important design parameter for sound-source localization systems, where the maximum time delay between the input signals is limited by the spacing of the microphones. For example, if the microphones are separated by approximately 35cm, the intersignal delay will be always |D|<1 ms. Applying a boundary to the output |Δ|<1.5 ms will guarantee that the loop stays within the covered range for x(t) sources with bandwidth lower than 200 Hz that have a $\tau_{MAX}$>2.5 ms. Low-pass filters can be used before the PCC-ATDE to limit the bandwidth of x(t) in some embodiments.

Figure 10:
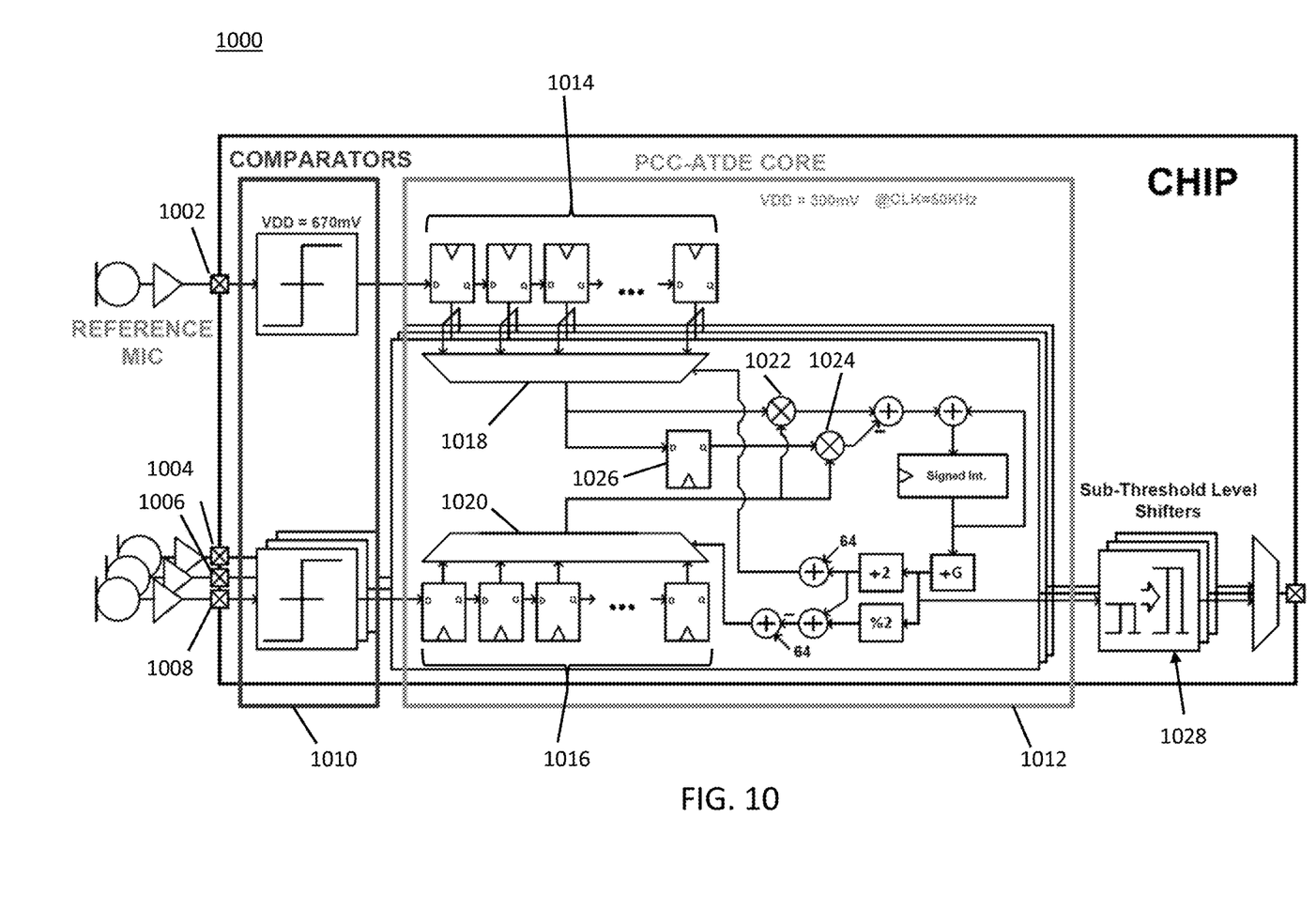
FIG. 10 is an example of chip implementation of a PCC-ATDE mechanism in accordance with some embodiments.

FIG. 10 illustrates an example of a CMOS embodiment of a time-discrete implementation of a PCC-ATDE TDE mechanism in accordance with some embodiments.

As shown, this mechanism can be implemented on a chip that has four analog inputs 1002, 1004, 1006, and 1008 that are connected to a microphone array. One of the microphones provides the reference for the time-delay estimation at input 1002; the chip outputs the time-delay of the other three analog signals with relation to this reference microphone.

Figure 11:
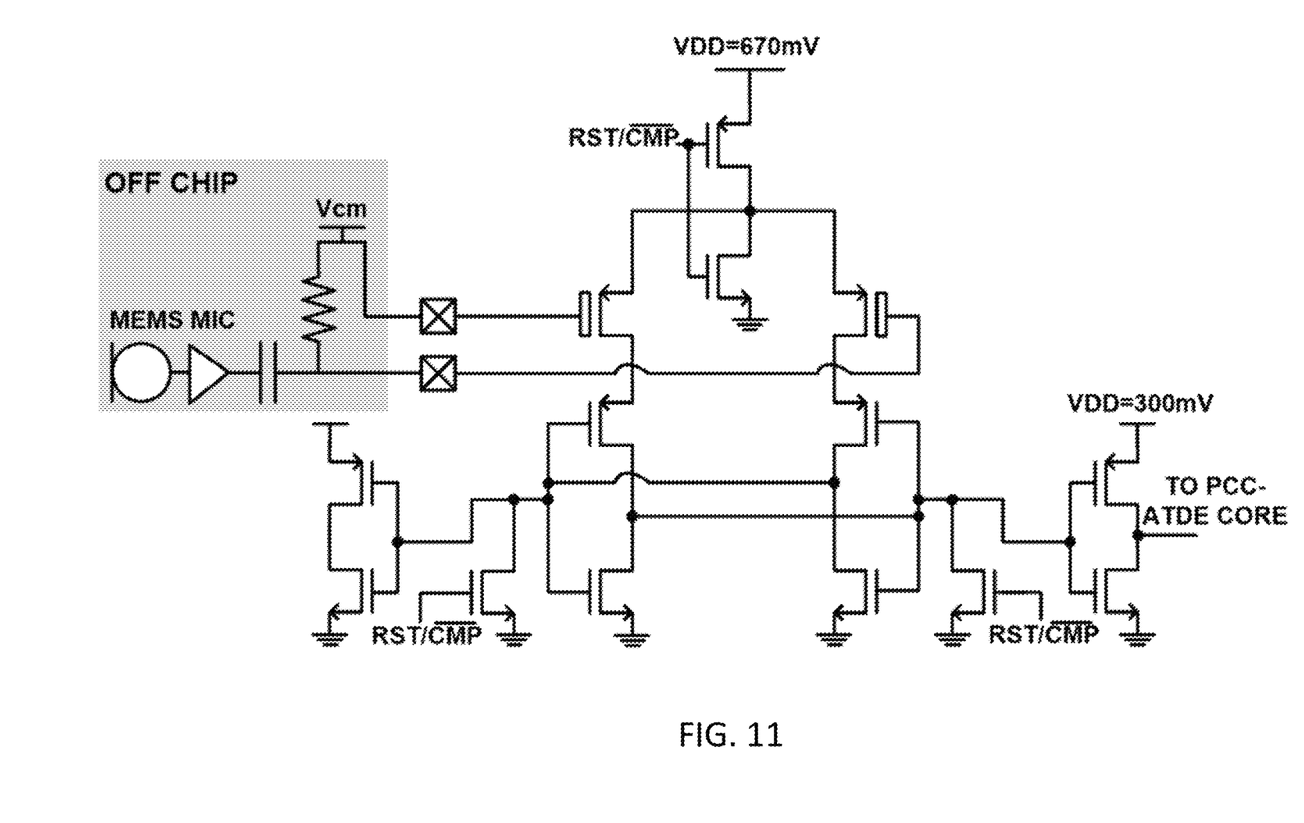
FIG. 11 is an example of latched comparator in accordance with some embodiments.

The inputs are provided to inputs of comparators 1010. Any suitable comparators can be used in some embodiments. For example, in some embodiments, each comparator can be implemented as a latched comparator as shown in FIG. 11.

The outputs of the comparators are then provided to PCC-ATDE core 1012. The core can be implemented in any suitable technology. For example, in some embodiments, the core can be implemented in 0.18 µm CMOS technology to take advantage of its low leakage current, while easily meeting speed and density requirements. The core of the PCC-ATDE can be implemented with sub-threshold CMOS logic in some embodiments.

As shown in FIG. 10, the variable delay cells can be implemented with chains of 128 (or any other suitable number) flip-flops 1014 and 1016 and multiplexers 1018 and 1020. Any suitable flip-flops and multiplexers can be used in some embodiments. The delay can be controlled by selecting the output of one of the stages of a flip-flop chain using the corresponding multiplexer. After the 1-bit quantization, the multiplications are easily computed with XOR logic gates forming multipliers 1022 and 1024. An extra flip-flop 1026 (which can be any suitable flip-flop in some embodiments), placed after the upper multiplexer, provides the fixed delay $\tau_{fix}$. A 10-bit register and adder can be used as an accumulator in some embodiments, and the 1/G attenuation can be realized with arithmetical shifts of 0, 1 or 2 bits. The output can be divided by two to evenly distribute, Δ[n], to both variable delay cells. In case of an odd Δ[n], one is added to the value of the lower variable delay cell.

Figure 12:
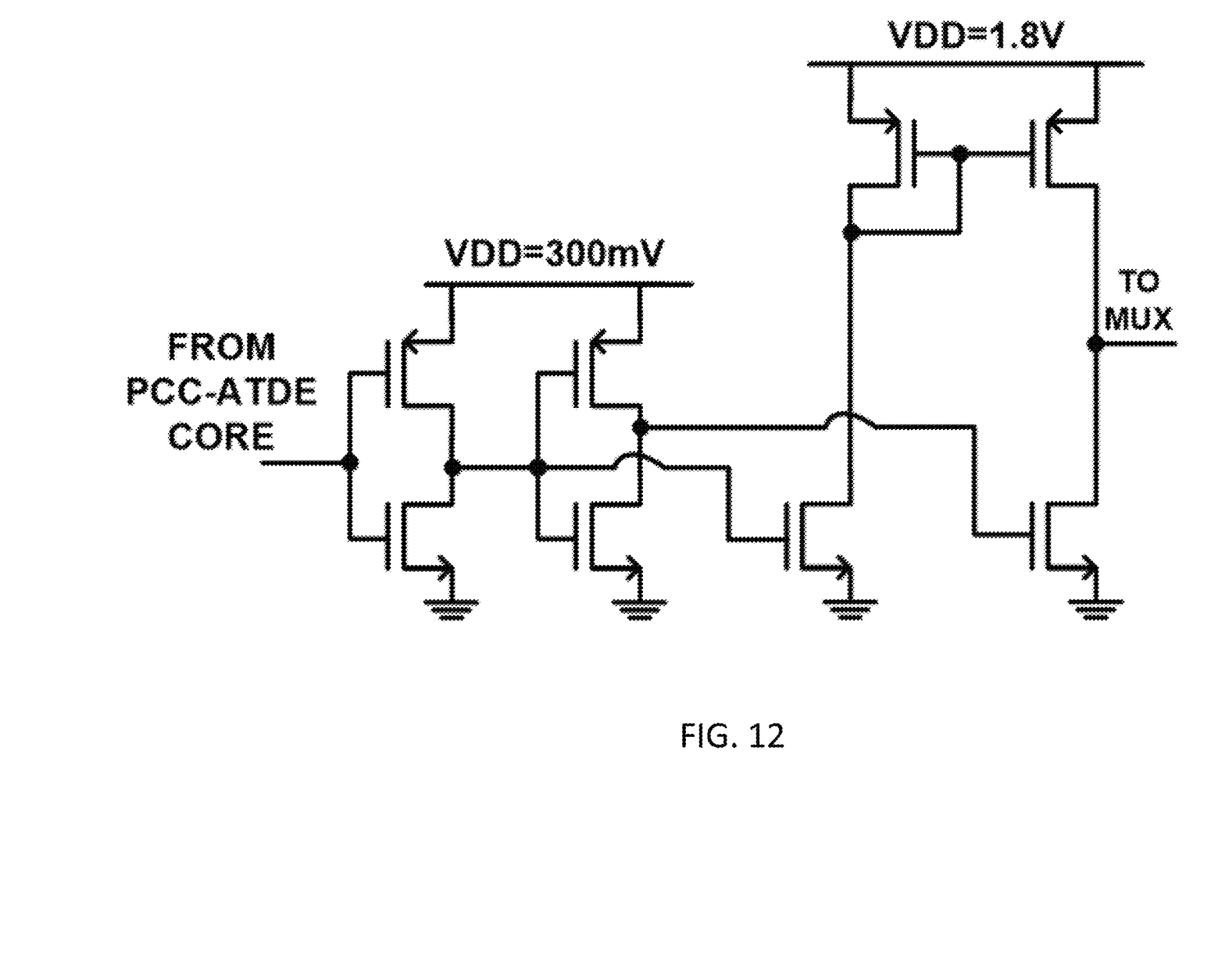
FIG. 12 is an example of sub-threshold level shifter in accordance with some embodiments.

In some embodiments, the 300 mV signals from the PCC-ATDE core can be converted to 1.8V I/O levels with the sub-threshold level shifters 1028. Any suitable level shifters can be used in some embodiments. For example, the level shifters shown in FIG. 12 can be used in some embodiments. In some embodiments, the level shifters are not required.

In some embodiments, the circuit of FIG. 10 can be used in an Internet of Things (IoT) embedded system for vehicle bearing estimation. The four microphones can be placed in a pyramid structure and connected to the circuit.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A circuit for a time-delay to digital converter, comprising:
   a first microphone having a first output;
   a second microphone having a second output;
   a first one-bit analog-to-digital converter having a first input coupled to the first output and having a third output;
   a second one-bit analog-to-digital converter having a second input coupled to the second output and having a fourth output;
   a first variable time delay having a third input coupled to the third output, a fourth input, and a fifth output, wherein the fourth input controls a delay amount of the first variable time delay;
   a second variable time delay having a fifth input coupled to the fourth output, a sixth input, and a sixth output, wherein the sixth input controls a delay amount of the second variable time delay;
   a first multiplier having a seventh input coupled to the fifth output, an eighth input coupled to the sixth output, and a seventh output;
   a third time delay having a ninth input coupled to the sixth output, and an eighth output;
   a second multiplier have a tenth input coupled to the fifth output, and an eleventh input coupled to the eighth output, and a ninth output;
   a subtractor having a twelfth input coupled to the seventh output, a thirteenth input coupled to the ninth output, and a tenth output;
   an accumulator having a fourteenth input coupled to the tenth output, and an eleventh output;
   an attenuator having a fifteenth input coupled to the eleventh output, and a twelfth output;
   a differential splitter having a sixteenth input coupled to the twelfth output, a thirteenth output, and a fourteenth output;
   a first adder having a seventeenth input coupled to the thirteenth output, an eighteenth input coupled to an offset signal, and a fifteenth output coupled to the sixth input; and
   a second adder having a nineteenth input coupled to the fourteenth output, a twentieth input coupled to the offset signal, and a sixteenth output coupled to the fourth input.

2. The circuit of claim 1, wherein at least one of the first one-bit analog-to-digital converter and the second one-bit analog-to digital converter is formed using a comparator.

3. The circuit of claim 1, wherein at least one of the first variable time delay and the second variable time delay is formed using a chain of flip flops and a multiplexer.

4. The circuit of claim 1, wherein the third time delay is a variable time delay.

5. The circuit of claim 1, wherein the third time delay is a fixed time delay.

6. The circuit of claim 5, wherein the third time delay is formed using a flip flop.

7. The circuit of claim 1, wherein at least one of the first multiplier and the second multiplier is formed using XOR gates.

8. The circuit of claim 1, wherein the accumulator is formed using a register and an adder.

9. The circuit of claim 1, wherein the attenuator is formed using a shifter.

10. The circuit of claim 1, further comprising:
a third adder having a twenty-first input coupled to the thirteenth output, a twenty-second input, and a seventeenth output coupled to the seventeenth input; and
a modulus 2 block having a twenty-third input coupled to the twelfth output and an eighteenth output coupled to the twenty-second input.

* * * * *